United States Patent
Uchida

(10) Patent No.: US 11,016,142 B2
(45) Date of Patent: May 25, 2021

(54) ADJUSTMENT METHOD OF INSPECTION SYSTEM AND AUXILIARY ELEMENT THEREFOR

(71) Applicant: Tokyo Electron Limited, Tokyo (JP)

(72) Inventor: Minoru Uchida, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 91 days.

(21) Appl. No.: 16/331,584

(22) PCT Filed: Jul. 25, 2017

(86) PCT No.: PCT/JP2017/026834
§ 371 (c)(1),
(2) Date: Mar. 8, 2019

(87) PCT Pub. No.: WO2018/047490
PCT Pub. Date: Mar. 15, 2018

(65) Prior Publication Data
US 2019/0219632 A1    Jul. 18, 2019

(30) Foreign Application Priority Data
Sep. 9, 2016   (JP) .............................. JP2016-176149

(51) Int. Cl.
*G01R 31/28*   (2006.01)
*H01L 21/67*   (2006.01)
(Continued)

(52) U.S. Cl.
CPC ......... *G01R 31/2868* (2013.01); *G01R 31/26* (2013.01); *G01R 31/2862* (2013.01);
(Continued)

(58) Field of Classification Search
CPC ........ G01R 31/2868–287; G01R 31/26; H01L 21/6719; H01L 21/67207; H01L 21/67253; H01L 21/37775; G06F 11/261
See application file for complete search history.

(56) References Cited

U.S. PATENT DOCUMENTS 5,262,716 A * 11/1993 Gregory, Jr. ..... G01R 31/31905
324/73.1
6,327,556 B1 * 12/2001 Geiger ............. G01R 31/31704
702/117
(Continued)

FOREIGN PATENT DOCUMENTS

JP   2007-235031 A   9/2007
JP   2008-004940 A   1/2008
(Continued)

OTHER PUBLICATIONS

International Search Report for International Application No. PCT/JP2017/026834, dated Oct. 10, 2017.

*Primary Examiner* — Patrick Assouad
*Assistant Examiner* — Demetrius R Pretlow
(74) *Attorney, Agent, or Firm* — Pearne & Gordon LLP

(57) ABSTRACT

The inspection system 100 is constructed by assembling inspection modules 10 configured to inspect inspection target objects and a transfer module 20 configured to transfer the inspection target object to the corresponding inspection module. The inspection system 100 is configured to transfer the inspection target objects into the inspection modules by the transfer module and inspect the inspection target objects in sequence. The adjustment method of the inspection system includes preparing an auxiliary element having a preset function of the inspection module 10 or a preset function of the transfer module 20; and adjusting, with respect to an adjustment which needs to be performed after the inspection system is constructed, the transfer module 20, or each of the (Continued)

inspection modules 10 or the inspection modules 10 as a single system by connecting the auxiliary element 60 (70, 80, 90) to the transfer module 20 or the inspection module 10.

13 Claims, 9 Drawing Sheets

(51) Int. Cl.
    *H01L 21/677*     (2006.01)
    *G01R 31/26*     (2020.01)

(52) U.S. Cl.
    CPC .... *H01L 21/6719* (2013.01); *H01L 21/67207* (2013.01); *H01L 21/67253* (2013.01); *H01L 21/67775* (2013.01)

(56) References Cited

U.S. PATENT DOCUMENTS

| | | | |
|---|---|---|---|
| 6,541,993 B2* | 4/2003 | Laureanti | G01R 31/2822 324/762.09 |
| 9,222,895 B2* | 12/2015 | Duffy | G01N 21/9501 |
| 2002/0143519 A1* | 10/2002 | Jain | G01R 31/318364 703/28 |
| 2003/0182641 A1* | 9/2003 | Yang | G01R 31/31715 714/725 |
| 2003/0201764 A1* | 10/2003 | Jafari | G01R 31/2886 324/750.23 |
| 2006/0247882 A1* | 11/2006 | Tada | G01R 31/31932 702/117 |
| 2007/0294580 A1* | 12/2007 | Lu | G01R 31/318357 714/33 |
| 2008/0068036 A1* | 3/2008 | Yun | G01R 31/318357 324/762.01 |
| 2010/0201390 A1* | 8/2010 | Takahaski | G01R 31/2863 324/756.03 |
| 2010/0204975 A1* | 8/2010 | Nakayama | G06F 30/33 703/20 |
| 2011/0089965 A1* | 4/2011 | Endres | G01R 35/00 324/755.01 |
| 2011/0298630 A1 | 12/2011 | Kiyokawa et al. | |
| 2014/0046613 A1* | 2/2014 | Roberts, Jr. | G01R 31/2601 702/108 |
| 2014/0129195 A1* | 5/2014 | He | G01R 31/2848 703/2 |
| 2015/0074653 A1* | 3/2015 | Eracar | G01R 31/31908 717/129 |
| 2017/0082670 A1* | 3/2017 | Lu | G01R 31/2834 |

FOREIGN PATENT DOCUMENTS

| | | |
|---|---|---|
| JP | 2013-254812 A | 12/2013 |
| WO | 2011/016096 A1 | 2/2011 |

\* cited by examiner

ADJUSTMENT METHOD OF INSPECTION SYSTEM AND AUXILIARY ELEMENT THEREFOR

TECHNICAL FIELD

The embodiments described herein pertain generally to an adjustment method of an inspection system and an auxiliary element therefor.

BACKGROUND ART

In a manufacturing process for a semiconductor device, an electrical inspection of an IC chip formed on a semiconductor wafer is performed. As an inspection apparatus for performing such an electrical inspection, there is used a probe apparatus configured to perform the electrical inspection by bringing probes into contact with electrodes of the semiconductor device formed on the semiconductor wafer.

To perform the electrical inspection efficiently on a multiple number of semiconductor wafers, there is proposed an inspection system in which a plurality of probe apparatuses (inspection apparatuses) are connected to a transfer unit (loader) (for example, Patent Document 1).

Typically, after performing assembly and adjustment of each of modules of the probe apparatuses (inspection apparatuses) and the transfer unit (loader), by docking these modules, this inspection system is constructed. Then, after performing various kinds of adjustments and inspections, these modules are separated again to be shipped out.

PRIOR ART DOCUMENT

Patent Document 1: Japanese Patent Laid-open Publication No. 2013-254812

DISCLOSURE OF THE INVENTION

In the conventional adjustment method, since the modules are separated again to be shipped out after the inspection system is constructed by docking the plurality of probe apparatuses and the transfer device as the modules before the shipment, a lead time taken before the shipment of the product is lengthened.

In view of the foregoing, exemplary embodiments provide a technique capable of shortening a lead time taken before shipment of an inspection system.

In one exemplary embodiment, there is provided an adjustment method of an inspection system configured to perform a preset adjustment on the inspection system before the inspection system is shipped. The inspection system is constructed by assembling multiple inspection modules configured to inspect inspection target objects and a transfer module configured to transfer the inspection target object to the corresponding inspection module. The inspection system is configured to transfer the inspection target objects into the respective inspection modules by the transfer module and inspect the inspection target objects in sequence. The adjustment method of the inspection system includes preparing an auxiliary element having a preset function of the inspection module or a preset function of the transfer module; and adjusting, with respect to an adjustment which needs to be performed after the inspection system is constructed by assembling the inspection modules and the transfer module, the transfer module, or each one of the inspection modules or the inspection modules as a single system by connecting the auxiliary element to the transfer module or the inspection module.

The auxiliary element includes a transfer module simulator as a virtual transfer module on software connected to the inspection module and configured to perform transmission/reception of the same control signal as that of the transfer module to/from the inspection module.

The auxiliary element includes an inspection module simulator as a virtual inspection module on software connected to the transfer module and configured to perform transmission/reception of the same control signal as that of the inspection module to/from the transfer module. In this case, when performing an adjustment of the transfer module by the inspection module simulator and when performing the adjustment of the transfer module by performing a transfer of the inspection target object with the transfer module based on a control signal from the inspection module simulator, a temporary placement jig, which is configured to place the inspection target object thereon and is a simulator of a stage of the inspection target object in the inspection module, is used.

The auxiliary element includes a virtual transfer module jig connected to the inspection module and configured to output, to the inspection module, an electric signal which is the same as an electric signal output from the transfer module.

The auxiliary element includes a virtual inspection module jig connected to the transfer module and configured to output, to the transfer module, an electric signal which is the same as an electric signal output from the inspection module.

The adjustment method of the inspection system further includes performing an adjustment of a preset operation by using inspection module adjustment self-diagnosis software configured to allow each one of the inspection modules to perform the preset operation virtually.

The adjustment method of the inspection system further includes providing, in a frame of the inspection system, a positioning jig in which a distance between positioning blocks of the inspection modules is set to a preset distance.

In another exemplary embodiment, there is provided an auxiliary element used in performing a preset adjustment on an inspection system before the inspection system is shipped. The inspection system is constructed by assembling multiple inspection modules configured to inspect inspection target objects and a transfer module configured to transfer the inspection target object to the corresponding inspection module. The inspection system is configured to transfer the inspection target objects into the respective inspection modules by the transfer module and inspect the inspection target objects in sequence. The auxiliary element has a preset function of the inspection module or a preset function of the transfer module and is connected to the transfer module or the inspection module. With respect to an adjustment which needs to be performed after the inspection system is constructed by assembling the inspection modules and the transfer module, the auxiliary element allows the transfer module, each one of the inspection modules or the inspection modules as a single system to be adjusted.

According to the exemplary embodiments, with respect to the adjustment which needs to be performed after the inspection system is constructed by assembling the inspection modules and the transfer module, the transfer module, or each one of the inspection modules or the inspection modules as a single system is adjusted by connecting the auxiliary element, which has a preset function of the inspection module or a preset function of the transfer module, to the transfer module or the inspection module. Accordingly, the inspection system need not be assembled before the shipment, so that the lead time taken before the shipment of the inspection system can be shortened.

DETAILED DESCRIPTION

Hereinafter, exemplary embodiments of the present disclosure will be described in detail with reference to the accompanying drawings, which form a part thereof.

<Configuration of Inspection System>

Figure 1:
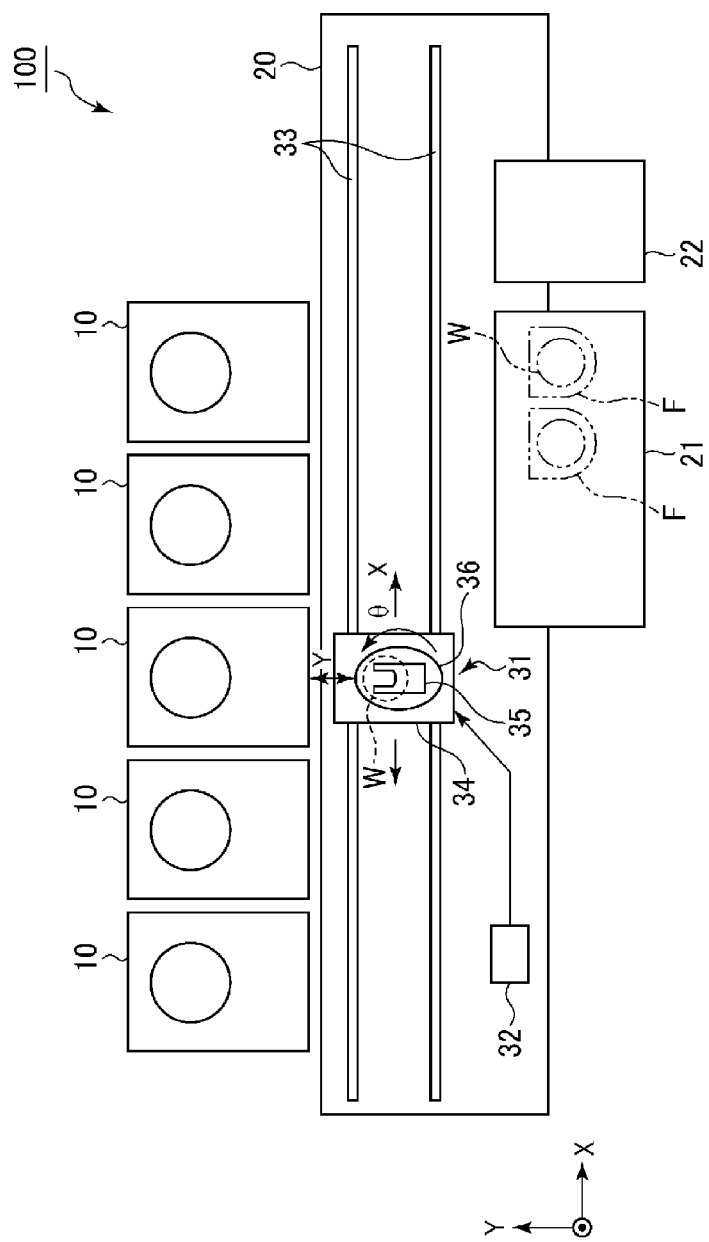
FIG. 1 is a plan view illustrating a schematic configuration of an example of an inspection system to which an adjustment method of the present disclosure is applied.
Figure 2:
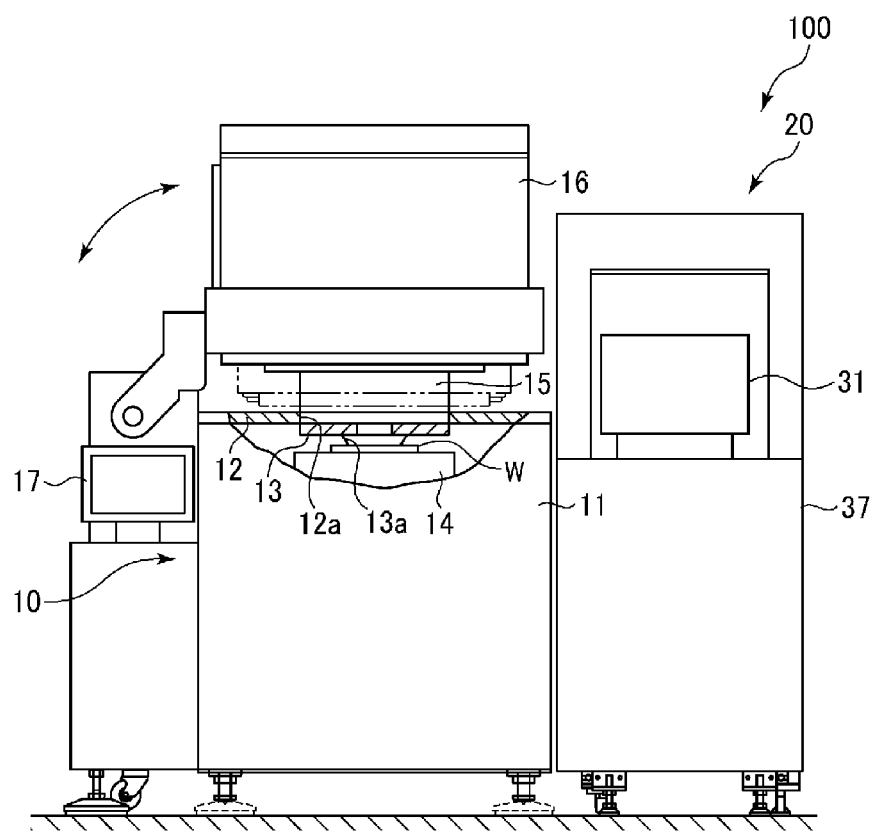
FIG. 2 is a side view illustrating a schematic configuration of the example of the inspection system to which the adjustment method of the present disclosure is applied.

FIG. 1 is a plan view illustrating a schematic configuration of an example of an inspection system to which an adjustment method of the present disclosure is applied, and FIG. 2 is a side view thereof. An inspection system 100 is configured to perform electrical inspection of a semiconductor wafer (hereinafter, simply referred to as "wafer") W as an inspection target. The inspection system 100 includes a plurality of (five in the present exemplary embodiment) probe apparatuses (inspection modules) 10 and a transfer unit (transfer module) 20.

The inspection system 100 is composed of the probe apparatuses 10 and the transfer unit 20 which are assembled in a frame, and the probe apparatuses 10 are arranged in a lengthwise direction of the transfer unit 20 (X direction in the drawing).

The transfer unit 20 is equipped with: a carry-in/out stage unit 21 having a multiple number of carry-in/out stages configured to perform a carry-in/out of the wafer W or a probe card; and a pre-alignment unit 22 configured to perform pre-alignment of the wafer W. For example, a FOUP F as a wafer receptacle is placed on the carry-in/out stage.

The probe apparatus 10 includes, as depicted in FIG. 2, a housing 11; a head plate 12 which forms a ceiling surface of the housing 11 and is provided with a circular hole 12a at a center thereof; a probe card 13 which is provided at a position corresponding to the hole 12a of the head plate 12 and has probe needles (contactors) 13a; and a stage 14 configured to place the wafer W thereon under the probe card 13.

The stage 14 is configured to be movable in the X, Y, Z and θ directions by an X-Y table mechanism, a Z-direction moving mechanism and a θ-direction moving mechanism (all of them are not illustrated), and is configured to position the wafer W, which is transferred from a delivery unit 31 of the transfer unit 20, at a preset inspection position.

Further, the probe needle (contactor) 13a of the probe card 13 is configured to be connected to a terminal of an IC chip of the wafer W.

Pivotably provided above the probe apparatus 10 is a test head 16 configured to connect the probe card 13 and a tester electrically. When the test head 16 is located at an inspection position directly above the probe apparatus 10, a connecting terminal (not shown) at a top surface of the probe card 13 is connected to the test head 16 via a connecting ring 15.

The transfer unit 20 is equipped with: the delivery unit 31 configured to deliver the wafer W to the probe apparatuses 10, the carry-in/out stage unit 21 and the pre-alignment unit 22; a driving mechanism 32 configured to move the delivery unit 31 in an arrangement direction of the probe apparatuses 10 (X direction); an LM guide 33 configured to guide the delivery unit 31 in the X direction; and a housing 37 accommodating these components therein (see FIG. 2).

The delivery unit 31 includes: a transfer base 34 configured to be movable on the LM guide 33 in the X direction; a transfer arm 35 configured to support the wafer W thereon and be movable in the Y direction, the Z direction (up and down directions) and the θ direction (rotation direction) with respect to the transfer base 34; an arm driving mechanism (not shown) configured to drive the transfer arm 35; and a cover member 36 configured to cover the wafer W on the transfer arm 35 when the transfer arm 35 is retreated. The cover member 36 is configured to be rotatable in the θ direction along with the transfer arm 35. The number of the transfer arm 35 may be one or more.

Figure 3:
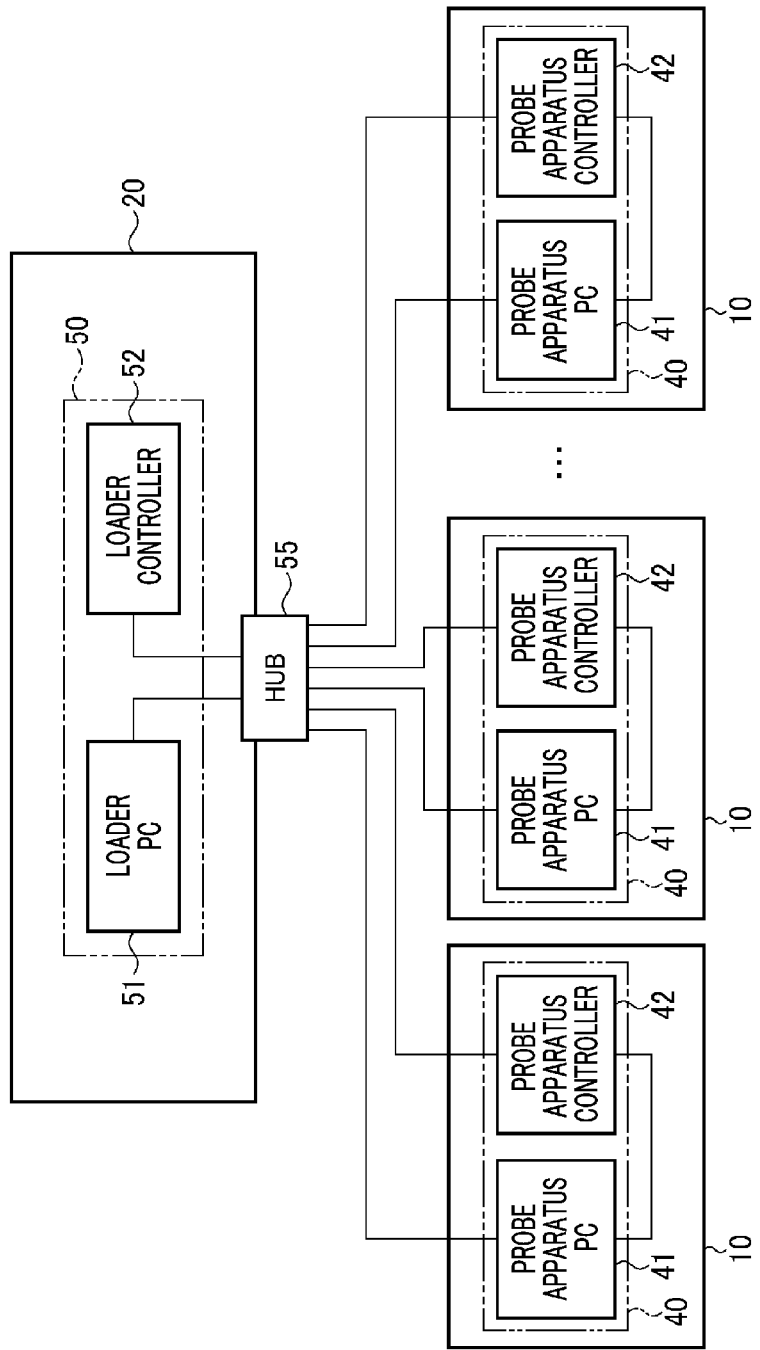
FIG. 3 is a block diagram showing control units of a probe apparatus and a transfer unit.

As depicted in FIG. 3, each probe apparatus 10 has a control unit 40 embedded therein, and a control unit 50 is embedded in the transfer unit 20. The control unit 40 of the probe apparatus 10 includes a probe apparatus PC (process computer) 41 and a probe apparatus controller 42. The probe apparatus PC 41 performs a high-level control, and the probe apparatus controller 42 performs a low-level control such as a control over a driving system. Further, the control unit 50 of the transfer unit 20 includes a loader PC 51 and a loader controller 52. The loader PC 51 performs a high-level control, and the loader controller 52 performs a low-level control such as a control over a drying system. The probe apparatus PC 41, the probe apparatus controller 42, the loader PC 51 and the loader controller 52 are connected by a LAN via a HUB 55, so that these can communicate with each other. The control unit 40 and the control unit 50 control the individual components of the probe apparatus 10 and the transfer unit 20, respectively, according to preset control programs (software). The probe apparatus PC 41 and the loader PC 51 are connected to and controlled by a computer configured to control an overall manufacturing process in a factory where the inspection system 100 are provided.

Further, the inspection system 100 has an on/off switch (not shown). When this switch is turned on or off, that electric signal is transmitted to the probe apparatuses 10 and the transfer unit 20. Further, an EMO (Emergency Off) signal of the transfer unit, an EMO signal of the tester, an interlock signal and a DOCK/UNLDOCK signal are sent from the transfer unit 20 to each probe apparatus 10. Further, an EMO signal of the probe apparatus 10, an interlock signal, an AIR ON signal are sent from each probe apparatus 10 to the transfer unit 20.

After an operation of the inspection system 100 as described above is begun, a wafer W before being inspected is taken out from a FOUP F on the carry-in/out stage by the delivery unit 31 of the transfer unit 20 and then delivered into the pre-alignment unit 22 based on a preset control program. The wafer W subjected to the pre-alignment is transferred onto the stage of a preset probe apparatus 10. Then, preset electrical inspection is performed on this wafer W in the probe apparatus 10. Thereafter, the inspected wafer W is received by the delivery unit 31 of the transfer unit 20 and then accommodated in the FOUP F. By performing these inspection operations on the wafer W continuously in parallel in the probe apparatuses 10, the inspections on the wafers W are performed efficiently.

Meanwhile, in such an inspection apparatus, in an assembling process before shipment, individual modules of the respective probe apparatuses 10 and the transfer unit 20 need to be assembled, and then, various kinds of adjustments need to be performed on them before the shipment. Some of the adjustments may be performed for each single module, but some of them need to be performed after building up the inspection system 100 by assembling the probe apparatuses 10 and the transfer unit 20 within the frame. Meanwhile, these modules need to be separated before being shipped. Thus, after carrying out the assembly and the various adjustments on the modules of the probe apparatuses 10 and the transfer unit 20, the inspection system is built up by docking these modules, and after various kinds of necessary adjustments and inspections are performed, these modules need to be disassemble from each other.

However, the work of building up the inspection system 100 by once docking the probe apparatuses 10 and the transfer unit 20 as the modules and separating these modules later again is troublesome and causes an increase of a lead time.

In view of this, according to the present exemplary embodiment, with respect to the adjustments which need to be performed after the inspection system 100 is built by assembling the probe apparatus 10 and the transfer unit 20, the transfer unit 20, each one of the probe apparatuses 10 or the probe apparatuses 10 as a system can be adjusted by connecting a preset auxiliary element to the probe apparatus 10 or the transfer unit 20. Therefore, the inspection system 100 need not be assembled before the shipment, so that the lead time before the shipment can be shortened as compared to the conventional case.

The auxiliary element includes:

(1) a probe apparatus simulator as a virtual probe apparatus on software, connected to the transfer unit 20 and configured to perform transmission/reception of a control signal on the software, which is the same as that of the probe apparatus 10, to/from the transfer unit 20;

(2) a transfer unit simulator as a virtual transfer unit on software, connected to the probe apparatus 10 and configured to perform transmission/reception of a control signal on the software, which is the same as that of the transfer unit 20, to/from the probe apparatus 10;

(3) a virtual transfer unit jig connected to the probe apparatus 10 and configured to apply, to the probe apparatus 10, the same electric signal as the one output from the transfer unit 20 to the probe apparatus 10; and (4) a virtual probe apparatus jig connected to the transfer unit 20 and configured to apply, to the transfer unit 20, the same electric signal as the one output from the probe apparatus 10 to the transfer unit 20.

Figure 4:
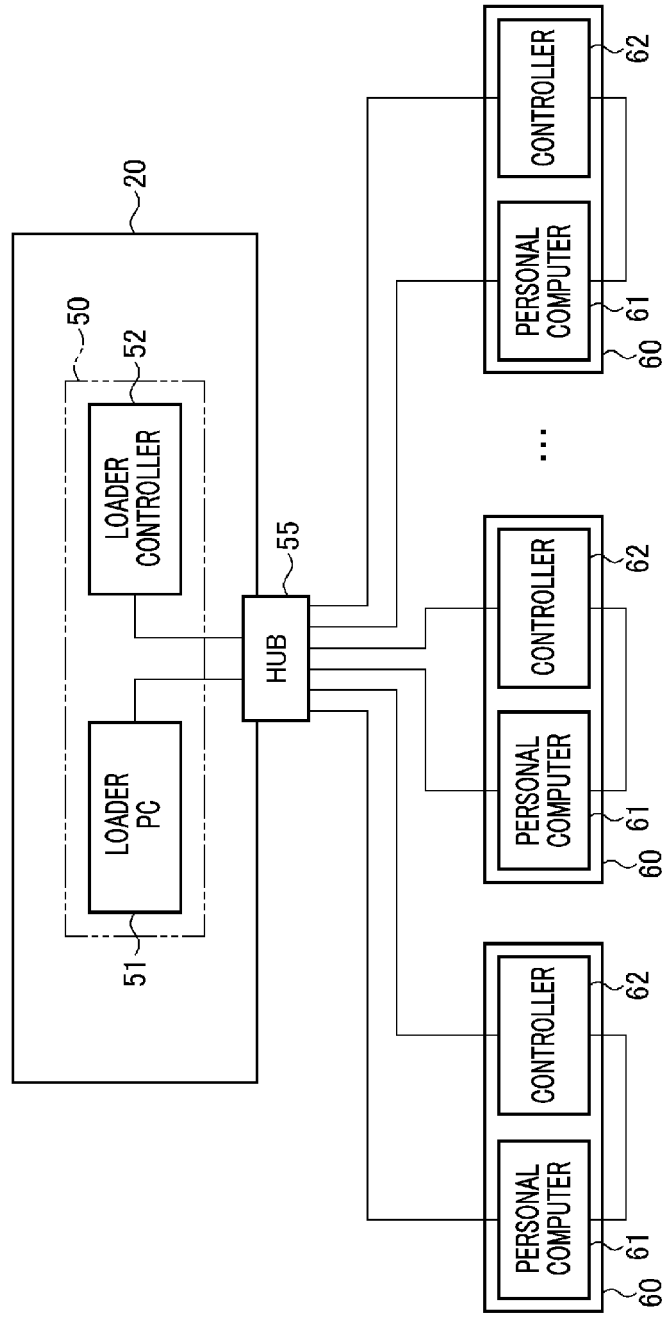
FIG. 4 is a conceptual diagram illustrating a probe apparatus simulator.

FIG. 4 is a conceptual diagram illustrating (1) the probe apparatus simulator. As shown in FIG. 4, a probe apparatus simulator 60 is connected to the real transfer unit 20 and includes a personal computer 61 and a controller 62 configured to perform the same control as the control system of the probe apparatus 10. The personal computer 61 has the same function as the probe apparatus PC 41 of the probe apparatus 10, and the controller 62 has the same function as the probe apparatus controller 42. The probe apparatus simulator 60 has self-diagnosis software (program) for performing self-diagnosis by communicating the same signal as that of the probe apparatus 10 with the transfer unit 20, and performs transmission/reception of signals required for preset checkup or adjustment (aging) of the transfer unit 20. The number of the probe apparatus simulator 60 is the same as the number of the probe apparatuses 10 (in the present exemplary embodiment, five) which need to be connected to the transfer unit 20.

To elaborate, the probe apparatus simulator 60 applies, to the transfer unit 20, a signal output from the probe apparatus 10 to the transfer unit 20, checks whether the transfer unit 20 is capable of carrying out preset communication with the probe apparatus 10, and then, performs adjustment if necessary.

Figure 5:
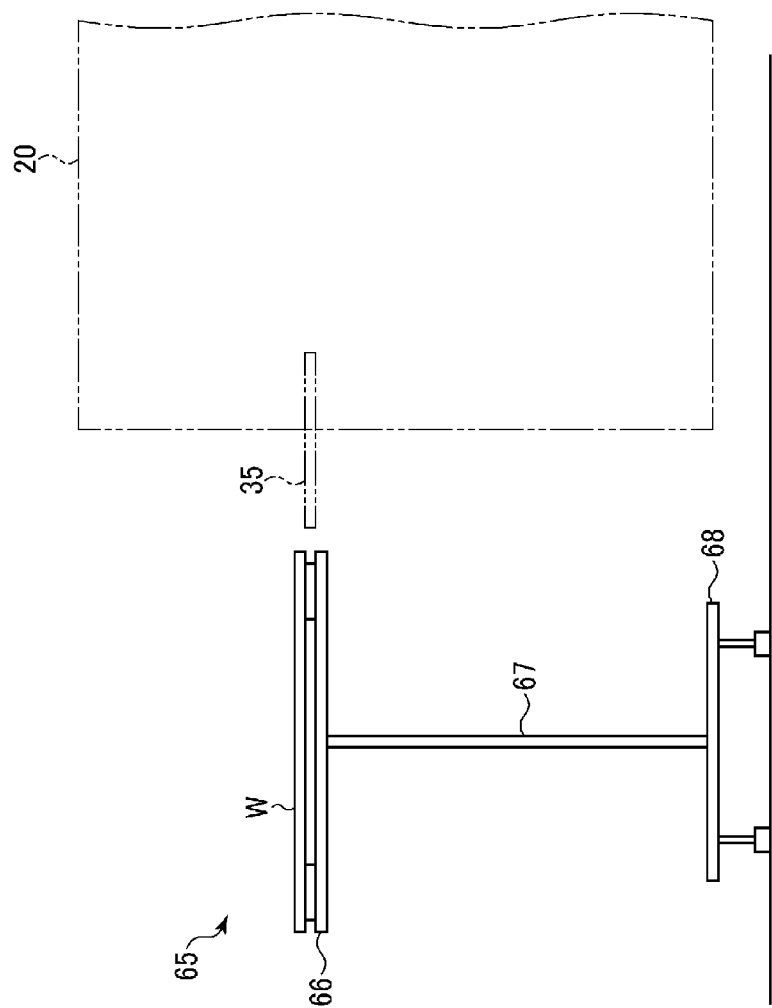
FIG. 5 is a schematic diagram illustrating a temporary placement jig used in performing an adjustment of the transfer unit by the probe apparatus simulator.

Further, the probe apparatus simulator 60 also performs the adjustment (aging) on a wafer transfer of the transfer unit 20. That is, the probe apparatus simulator 60 outputs a transfer signal to the transfer unit 20 to allow the wafer W to be transferred by the transfer unit 20 and performs adjustment of the transfer operation. At this time, since the transfer unit 20 really performs the wafer transfer in response to the signal from the probe apparatus simulator 60, a temporary wafer placement jig 65 is used, as shown in FIG. 5. This temporary wafer placement jig 65 is designed on the assumption that the wafer W is transferred onto the stage of the probe apparatus 10 by the transfer arm 35 of the transfer unit 20. Further, the temporary wafer placement jig 65 includes a temporary placement stage 66 set to have the same height as the stage 14 of the real probe apparatus 10; a supporting member 67 configured to support the temporary placement stage 66; and a base member 68.

Further, the software of the probe apparatus simulator 60 changes the contents of update of presence/absence of the wafer and opening/closing of a shutter.

Figure 6:
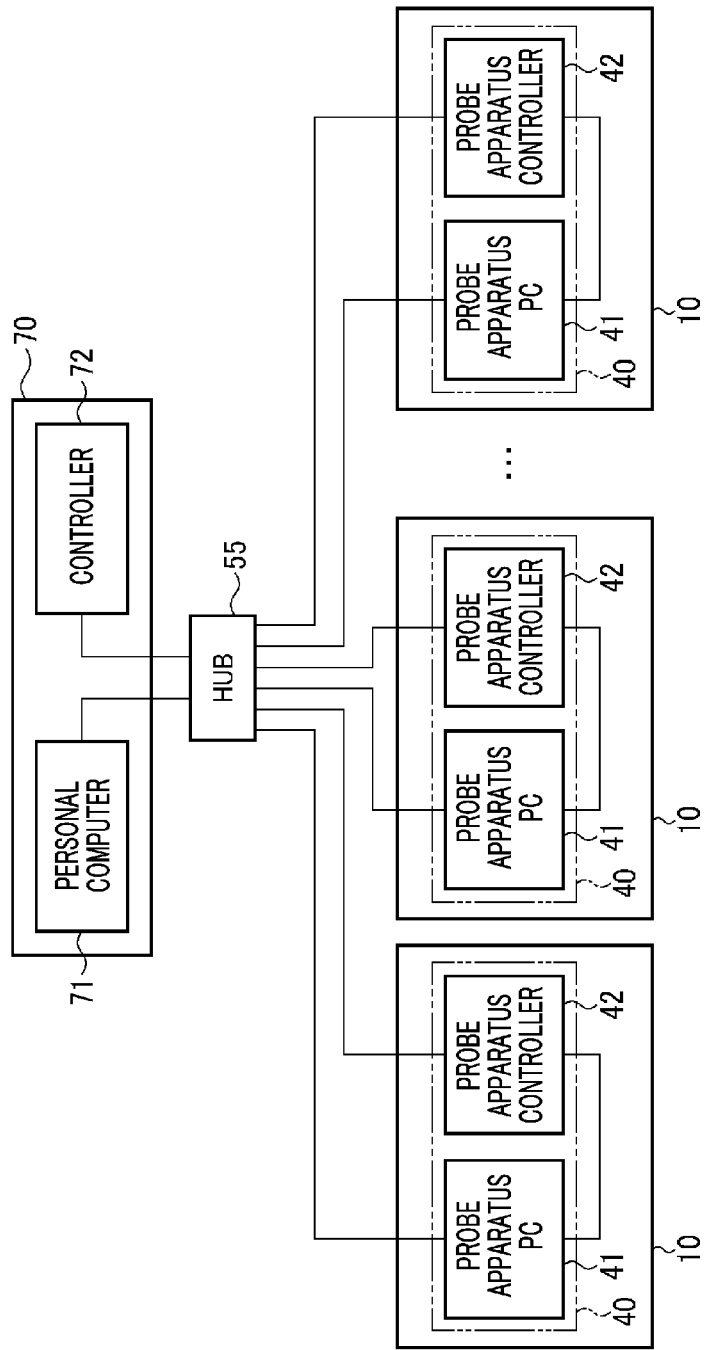
FIG. 6 is a conceptual diagram illustrating a transfer unit simulator.

FIG. 6 is a conceptual diagram showing (2) the transfer unit simulator. As depicted in FIG. 6, the transfer unit simulator 70 is connected to the real probe apparatus 10, and includes a personal computer 71 and a controller 72 configured to perform the same control as the control system of the transfer unit 20. The personal computer 71 has the same function as the loader PC 51 of the transfer unit 20, and the controller 72 has the same function as the loader controller 52. Further, the transfer unit simulator 70 has software for communicating the same signal as that of the probe apparatus 10 with the transfer unit 20 and performing transmission/reception of signals required for preset checkup or adjustment (aging) of the probe apparatus 10.

The transfer unit simulator 70 applies, to the probe apparatus 10, a signal output from the transfer unit 20 to the probe apparatus 10, checks whether the probe apparatus 10 is capable of carrying out preset communication with the transfer unit 20, and performs adjustment if necessary.

Further, the transfer unit simulator 70 applies a signal for starting the system to the transfer unit 20 from the controller 72, checks whether the inspection system 100 is started, and performs preset adjustment if necessary.

Moreover, the transfer unit simulator 70 applies a trigger signal for system initialization to the probe apparatus 10 from the personal computer 71, thus allowing the probe apparatus 10 to perform an operation such as an origin point search. If a predetermined initial operation is performed, an OK signal is outputted, and then, adjustment is performed if necessary. In addition, the transfer unit simulator 70 checks, by the personal computer 71, an indication of a display 17 of the probe apparatus 10 and then performs adjustment, if necessary.

Figure 7:
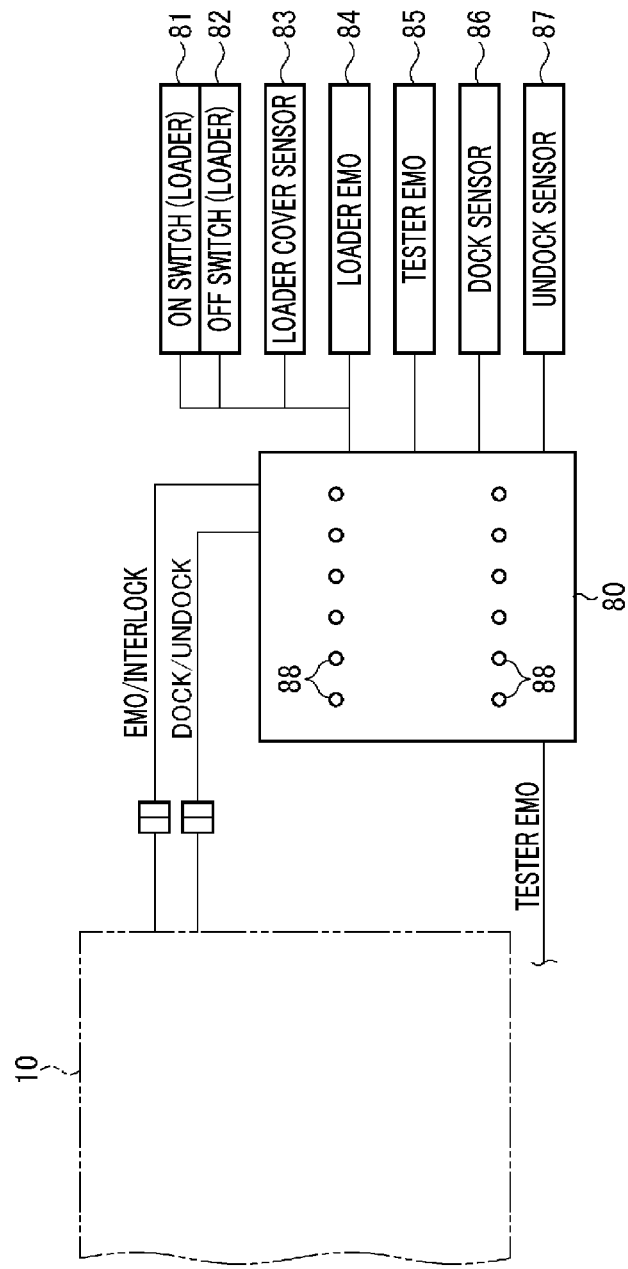
FIG. 7 is a configuration view illustrating a virtual transfer unit jig.

FIG. 7 is a configuration view illustrating (3) the virtual transfer unit jig. As depicted in FIG. 7, the virtual transfer unit jig 80 is configured as a controller. Connected to the virtual transfer unit jig 80 are an on switch 81 and an off switch 82 of the transfer unit (loader) 20, a cover sensor switch (loader cover sensor) 83 of the transfer unit 20, an EMO switch (loader EMO) 84 of the transfer unit 20, an EMO switch (tester EMO) 85 of the tester, a DOCK sensor switch (DOCK sensor) 86 and an UNDOCK sensor switch (UNDOCK sensor) 87.

By turning these switches on, the virtual transfer unit jig 80 outputs a power ON/OFF signal, a loader EMO signal, an interlock signal, a tester EMO signal, and a DOCK/UNDOCK signal to the probe apparatus 10, and performs an operation check on a power ON/OFF, an interlock of the transfer unit 20, an 10 check and an EMO of the transfer unit 20 and the tester through these signals. These operation checks of the power ON/OFF, the interlock of the transfer unit 20 and the EMO of the transfer unit 20 and the tester are performed through LEDs 88 provided at the virtual transfer unit jig 80, and the operation check of the 10 check is performed through an IO read-write display. If any operation is not checked, preset adjustment is performed.

Figure 8:
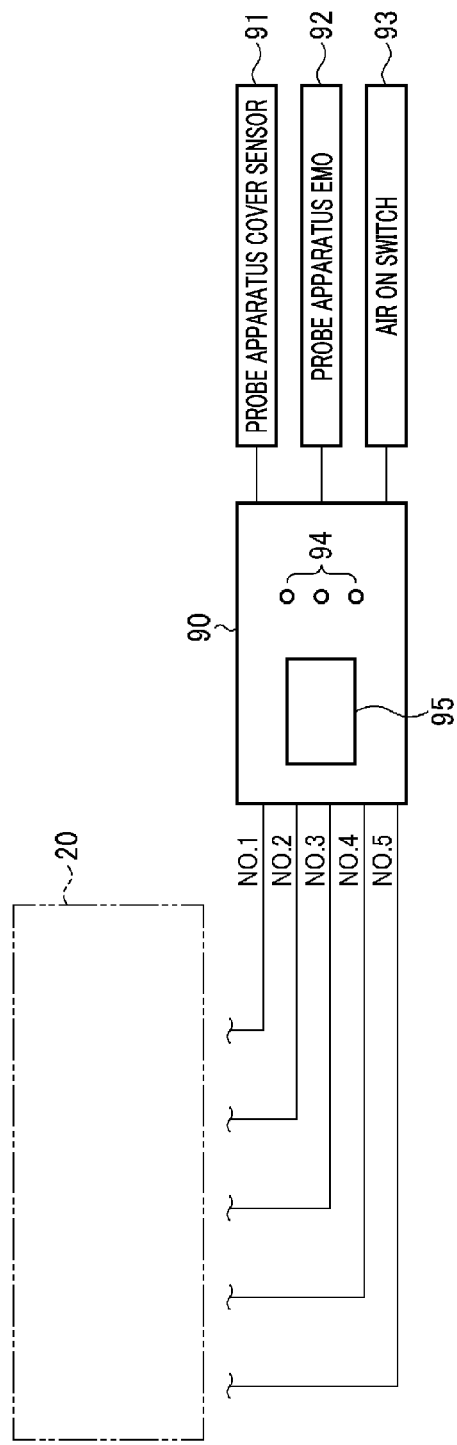
FIG. 8 is a configuration view illustrating a virtual probe apparatus jig.

FIG. 8 is a configuration view of (4) the virtual probe apparatus jig. As shown in FIG. 8, the virtual probe apparatus jig 90 is configured as a controller. Connected to the virtual probe apparatus jig 90 are a cover sensor switch (probe apparatus cover sensor) 91 of the probe apparatus 10, an EMO switch (probe apparatus EMO) 92 of the probe apparatus 10 and an AIR ON switch 93. Further, the virtual probe apparatus jig 90 is connected to wirings of a plurality of (here, five from No. 1 to No. 5) connecting portions of the transfer unit 20 to be connected with the probe apparatus 10.

By turning these switches on, the virtual probe apparatus jig 90 outputs a probe apparatus EMO signal, an interlock signal, an AIR operation signal to the transfer unit 20, and performs an operation check on an EMO of the probe apparatus 10, an interlock of the probe apparatus 10 and an AIR ON through these signals. The operation check thereof is performed through LEDs 94 provided at the virtual probe apparatus jig 90. The operation check is automatically performed for the probe apparatuses No. 1 to No. 5, and in case of NG, an error sign is displayed on a display screen 95. If the error sign comes out, the preset adjustment is performed.

Further, the operation check of the transfer unit 20 by the power ON/OFF signal may be performed by additionally connecting a personal computer.

Besides the auxiliary elements shown in (1) to (4) described above, there may be used probe apparatus adjustment self-diagnosis software capable of checking and adjusting the operation of the probe apparatus 10 to virtually perform the preset operation on the probe apparatus 10 as a single body.

Such probe apparatus adjustment self-diagnosis software is embedded in the control unit 40 of the probe apparatus 10. By way of example, this probe apparatus adjustment self-diagnosis software allows the stage 14 and the shutter of the probe apparatus 10 to perform preset operations, checks whether a stress at the time of driving is not applied to wiring and pipelines within the probe apparatus 10, and then, performs adjustment if the stress is applied. To be specific, the following operations a) to d) are repeated by the probe apparatus adjustment self-diagnosis software:
 a) stage initial operation
 b) shutter opening/closing operation
 c) wafer alignment operation on the stage
 d) X, Y, Z and θ full-stroke driving of the stage Conventionally, these operations are performed after the inspection system is constructed. However, by incorporating this probe apparatus adjustment self-diagnosis software in the control unit 40 of the probe apparatus 10, the adjustment of the probe apparatus 10 as the single body is enabled.

Figure 9:
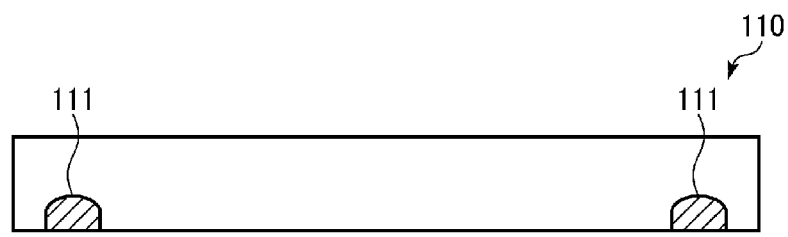
FIG. 9 is a diagram illustrating a positioning jig configured to set a distance between positioning blocks of respective probe apparatuses to a predetermined distance.

Besides, it may be effective to use a positioning jig for removing a position deviation of the probe apparatus 10 due to an error in mounting positioning blocks of the probe apparatus 10. That is, as shown in FIG. 9, a positioning jig 110 in which a distance between the positioning blocks 111 of the probe apparatus 10 is set to a preset distance is mounted to the frame. With this configuration, when the probe apparatus is shipped, the position deviation of the probe apparatus 10 that might be caused as the inspection system is not assembled can be suppressed.

<Other Applications>

Further, the above-described exemplary embodiment is not limiting, and various changes and modifications may be made without departing from the scope of the present disclosure. By way of example, in the above-described exemplary embodiment, the inspection system constructed by assembling the probe apparatuses with the specific structure as the inspection modules and the transfer unit with the specific structure as the transfer module has been described as an example. However, the structures of the probe apparatus and the transfer unit (transfer module) are not limited to those described in the exemplary embodiment, and another inspection module may be used instead of the probe apparatus.

Moreover, in the above-described exemplary embodiment, the auxiliary elements (1) to (4) are used. However, these auxiliary elements are nothing more than examples and are not particularly limited as long as they allow the adjustment, which needs to be performed after constructing the inspection system by assembling the inspection module such as the probe apparatus and the transfer module such as the transfer unit, to be performed on the single module of the inspection module and the transfer module.

Furthermore, though the above exemplary embodiment has been described for the inspection system configured to inspect the semiconductor wafer, the inspection system may be configured to inspect an inspection target object other than the semiconductor wafer.

EXPLANATION OF CODES

10: Probe apparatus (inspection module)
11: Housing
12: Head plate
14: Stage
20: Transfer unit (transfer module)
21: Carry-in/out stage
22: Pre-alignment unit 31: Delivery unit
32: Driving mechanism
40, 50: Control unit
41: Probe apparatus PC
42: Probe apparatus controller
51: Loader PC
52: Loader controller
55: HUB
60: Probe apparatus simulator (auxiliary element)
70: Transfer unit simulator (auxiliary element)
80: Virtual transfer unit jig (auxiliary element)
90: Virtual probe apparatus jig (auxiliary element)
100: Inspection system
W: Semiconductor wafer (transfer target object)

I claim:

1. An adjustment method of an inspection system configured to perform a preset adjustment on the inspection system before the inspection system is shipped, the inspection system being constructed by assembling multiple inspection modules configured to inspect inspection target objects and a transfer module configured to transfer the inspection target object to the corresponding inspection module, the inspection system being configured to transfer the inspection target objects into the respective inspection modules by the transfer module and inspect the inspection target objects in sequence, and the inspection system being configured to be shipped with each separated module, the adjustment method of the inspection system comprising:
preparing an auxiliary element having a preset function of the inspection module or a preset function of the transfer module; and
adjusting, in a state that the inspection modules and the transfer module are separated, with respect to an adjustment which needs to be performed after the inspection system is constructed by assembling the inspection modules and the transfer module, the transfer module, or each one of the inspection modules or the inspection modules as a single system by connecting the auxiliary element to the transfer module or the inspection module.

2. The adjustment method of the inspection system of claim 1,
wherein the auxiliary element includes a transfer module simulator as a virtual transfer module on software connected to the inspection module and configured to perform transmission/reception of the same control signal as that of the transfer module to/from the inspection module.

3. The adjustment method of the inspection system of claim 1,
wherein the auxiliary element includes an inspection module simulator as a virtual inspection module on software connected to the transfer module and configured to perform transmission/reception of the same control signal as that of the inspection module to/from the transfer module.

4. The adjustment method of the inspection system of claim 3,
wherein when performing an adjustment of the transfer module by the inspection module simulator and when performing the adjustment of the transfer module by performing a transfer of the inspection target object with the transfer module based on a control signal from the inspection module simulator, a temporary placement jig, which is configured to place the inspection target object thereon and is a simulator of a stage of the inspection target object in the inspection module, is used.

5. The adjustment method of the inspection system of claim 1,
wherein the auxiliary element includes a virtual transfer module jig connected to the inspection module and configured to output, to the inspection module, an electric signal which is the same as an electric signal output from the transfer module.

6. The adjustment method of the inspection system of claim 1,
wherein the auxiliary element includes a virtual inspection module jig connected to the transfer module and configured to output, to the transfer module, an electric signal which is the same as an electric signal output from the inspection module.

7. The adjustment method of the inspection system of claim 1, further comprising:
performing an adjustment of a preset operation by using inspection module adjustment self-diagnosis software configured to allow each one of the inspection modules to perform the preset operation virtually.

8. The adjustment method of the inspection system of claim 1, further comprising:
providing, in a frame of the inspection system, a positioning jig in which a distance between positioning blocks of the inspection modules is set to a preset distance.

9. An auxiliary element used in performing a preset adjustment on an inspection system before the inspection system is shipped, the inspection system being constructed by assembling multiple inspection modules configured to inspect inspection target objects and a transfer module configured to transfer the inspection target object to the corresponding inspection module, the inspection system being configured to transfer the inspection target objects into the respective inspection modules by the transfer module and inspect the inspection target objects in sequence, and the inspection system being configured to be shipped with each separated module,
wherein the auxiliary element has a preset function of the inspection module or a preset function of the transfer module and is connected to the transfer module or the inspection module, and
with respect to an adjustment which needs to be performed after the inspection system is constructed by assembling the inspection modules and the transfer module, in a state that the inspection modules and the transfer module are separated, the auxiliary element allows the transfer module, each one of the inspection modules or the inspection modules as a single system to be adjusted.

10. The auxiliary element of claim 9, comprising:
a transfer module simulator as a virtual transfer module on software connected to the inspection module and configured to perform transmission/reception of the same control signal as that of the transfer module to/from the inspection module.

11. The auxiliary element of claim 9, comprising:
an inspection module simulator as a virtual inspection module on software connected to the transfer module and configured to perform transmission/reception of the same control signal as that of the inspection module to/from the transfer module.

12. The auxiliary element of claim 9, comprising:
a virtual transfer module jig connected to the inspection module and configured to output, to the inspection module, an electric signal which is the same as an electric signal output from the transfer module.

13. The auxiliary element of claim 9, comprising:
a virtual inspection module jig connected to the transfer module and configured to output, to the transfer module, an electric signal which is the same as an electric signal output from the inspection module.

* * * * *